United States Patent
Liu et al.

(10) Patent No.: US 11,201,603 B2
(45) Date of Patent: Dec. 14, 2021

(54) ACTIVE CLAMP CAPACITOR BALANCING

(71) Applicant: TEXAS INSTRUMENTS INCORPORATED, Dallas, TX (US)

(72) Inventors: Pei-Hsin Liu, Westford, MA (US); Richard Lee Valley, Nashua, NH (US); Bharath Balaji Kannan, Merrimack, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/905,469

(22) Filed: Jun. 18, 2020

(65) Prior Publication Data

US 2021/0006236 A1    Jan. 7, 2021

Related U.S. Application Data

(60) Provisional application No. 62/869,134, filed on Jul. 1, 2019.

(51) Int. Cl.
| | |
|---|---|
| *H03H 11/32* | (2006.01) |
| *H03K 3/037* | (2006.01) |
| *H03K 5/24* | (2006.01) |
| *H02M 3/28* | (2006.01) |

(52) U.S. Cl.
CPC ............ *H03H 11/32* (2013.01); *H02M 3/285* (2013.01); *H03K 3/037* (2013.01); *H03K 5/24* (2013.01)

(58) Field of Classification Search
None
See application file for complete search history.

(56) References Cited

U.S. PATENT DOCUMENTS

| | | | | |
|---|---|---|---|---|
| 6,944,034 | B1 * | 9/2005 | Shteynberg | H02M 3/33523 363/21.13 |
| 7,203,080 | B2 * | 4/2007 | Aso | H02M 3/33507 363/95 |
| 7,382,633 | B2 * | 6/2008 | Aso | H02M 3/33507 363/21.04 |
| 8,320,139 | B2 * | 11/2012 | Hu | H02M 3/33523 363/21.13 |
| 8,693,223 | B2 * | 4/2014 | Lin | H02M 3/33507 363/56.12 |
| 9,621,029 | B2 * | 4/2017 | Gritti | H02M 1/4258 |
| 9,667,155 | B2 * | 5/2017 | Matsuda | H02M 3/33515 |
| 9,787,194 | B2 * | 10/2017 | Li | H02M 1/15 |

* cited by examiner

*Primary Examiner* — Jeffery S Zweizig
(74) *Attorney, Agent, or Firm* — Mark Allen Valetti; Charles A. Brill; Frank D. Cimino

(57) ABSTRACT

In some examples, a circuit includes an input circuit, an output circuit, an auxiliary circuit, and a balancing circuit. The input circuit comprises a primary capacitor coupled to primary windings of a transformer. The output circuit comprises a secondary capacitor coupled to secondary windings of the transformer, wherein the secondary windings are coupled to the primary windings. The auxiliary circuit comprises auxiliary windings coupled to the primary windings. The balancing circuit is coupled to the output circuit, the auxiliary circuit, and the input circuit. The balancing circuit is configured to balance a voltage across the primary capacitor with a voltage across the secondary capacitor.

19 Claims, 4 Drawing Sheets

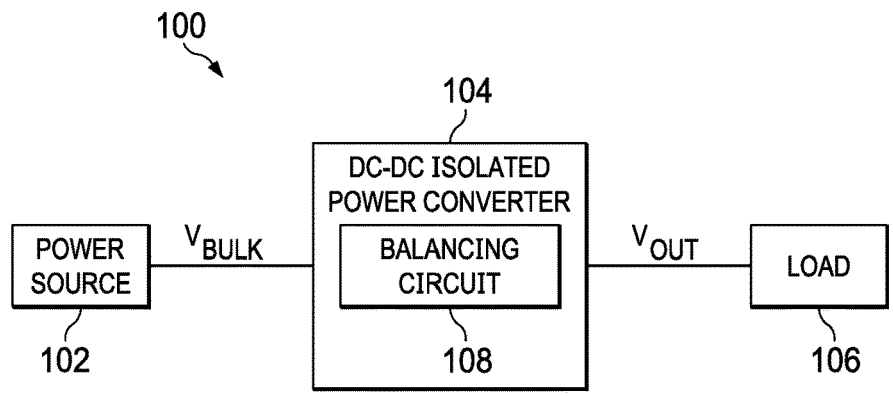
FIG. 1
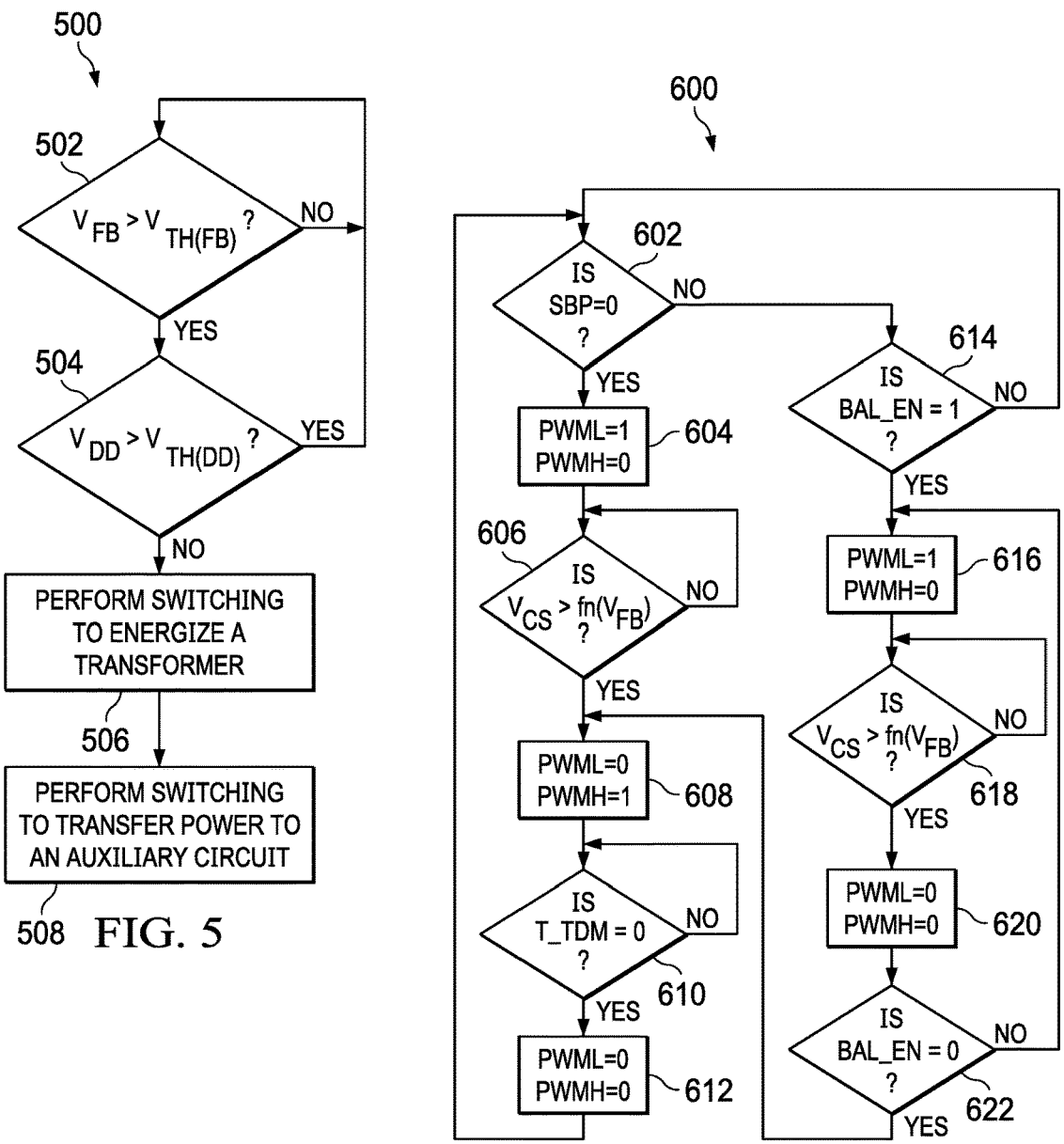
FIG. 5
FIG. 6

US 11,201,603 B2

ACTIVE CLAMP CAPACITOR BALANCING

CROSS-REFERENCE TO RELATED APPLICATIONS

The present application claims priority to U.S. Provisional Patent Application No. 62/869,134, which was filed Jul. 1, 2019, is titled "Capacitor Voltage Balance Control For Isolated Converters With An Active Clamp Circuit," and is hereby incorporated herein by reference in its entirety.

BACKGROUND

An isolated power converter electrically and physically separates an input circuit from an output circuit, creating separate ground references for each of the input circuit and the output circuit. The isolated power converter is sometimes implemented as a transformer in which current does not directly flow between the input and output circuits, but instead voltage is transferred through electromagnetic fields. Both the input circuit and the output circuit often include one or more capacitors that have loads that can become mismatched during operation of the isolated power converter. The mismatched loads can create large voltage balancing currents in the isolated power converter.

SUMMARY

In some examples, a circuit includes an input circuit, an output circuit, an auxiliary circuit, and a balancing circuit. The input circuit comprises a primary capacitor coupled to primary windings of a transformer. The output circuit comprises a secondary capacitor coupled to secondary windings of the transformer, wherein the secondary windings are electromagnetically coupled to the primary windings. The auxiliary circuit comprises auxiliary windings electromagnetically coupled to the primary windings. The balancing circuit is coupled between the output circuit, the auxiliary circuit, and the input circuit. The balancing circuit is configured to balance a voltage across the primary capacitor with a voltage across the secondary capacitor.

In other examples, a system includes a power source, a load, a power converter, and a balancing circuit. The power converter is coupled between the power source and the load. The power converter comprises a transformer, an input circuit, an output circuit, an auxiliary circuit, and a balancing circuit. The transformer has primary windings, secondary windings and auxiliary windings, where the primary windings are electromagnetically coupled to the secondary windings and the auxiliary windings. The input circuit comprises a primary capacitor coupled to the primary windings of a transformer. The output circuit comprises a secondary capacitor coupled to the secondary windings of the transformer. The auxiliary circuit comprises the auxiliary windings. The balancing circuit is coupled to the output circuit, the auxiliary circuit, and the input circuit. The balancing circuit is configured to balance a voltage across the primary capacitor with a voltage across the secondary capacitor.

In other examples, a circuit includes a balancing circuit and control logic. The balancing circuit is configured to determine whether a feedback voltage exceeds a feedback voltage threshold, determine whether a supply voltage is not greater than a supply voltage threshold, and assert a balancing function enable signal based on the feedback voltage exceeding the feedback voltage threshold and the supply voltage is not greater than the supply voltage threshold. The control logic is configured to generate transistor control signals configured to cause a transformer to transfer energy to an output circuit configured to generate an output voltage and an auxiliary circuit responsive to the feedback voltage not exceeding the feedback voltage threshold, wherein the auxiliary circuit generates the supply voltage. The control logic is further configured to generate transistor control signals configured to cause the transformer to transfer energy to the auxiliary circuit responsive to the balancing function enable signal being asserted.

BRIEF DESCRIPTION OF THE DRAWINGS

FIG. 1 shows a block diagram of an illustrative system in accordance with various examples.

FIG. 5 shows a flowchart of an illustrative method in accordance with various examples.

FIG. 6 shows a flowchart of an illustrative method in accordance with various examples.

DETAILED DESCRIPTION

Figure 2:
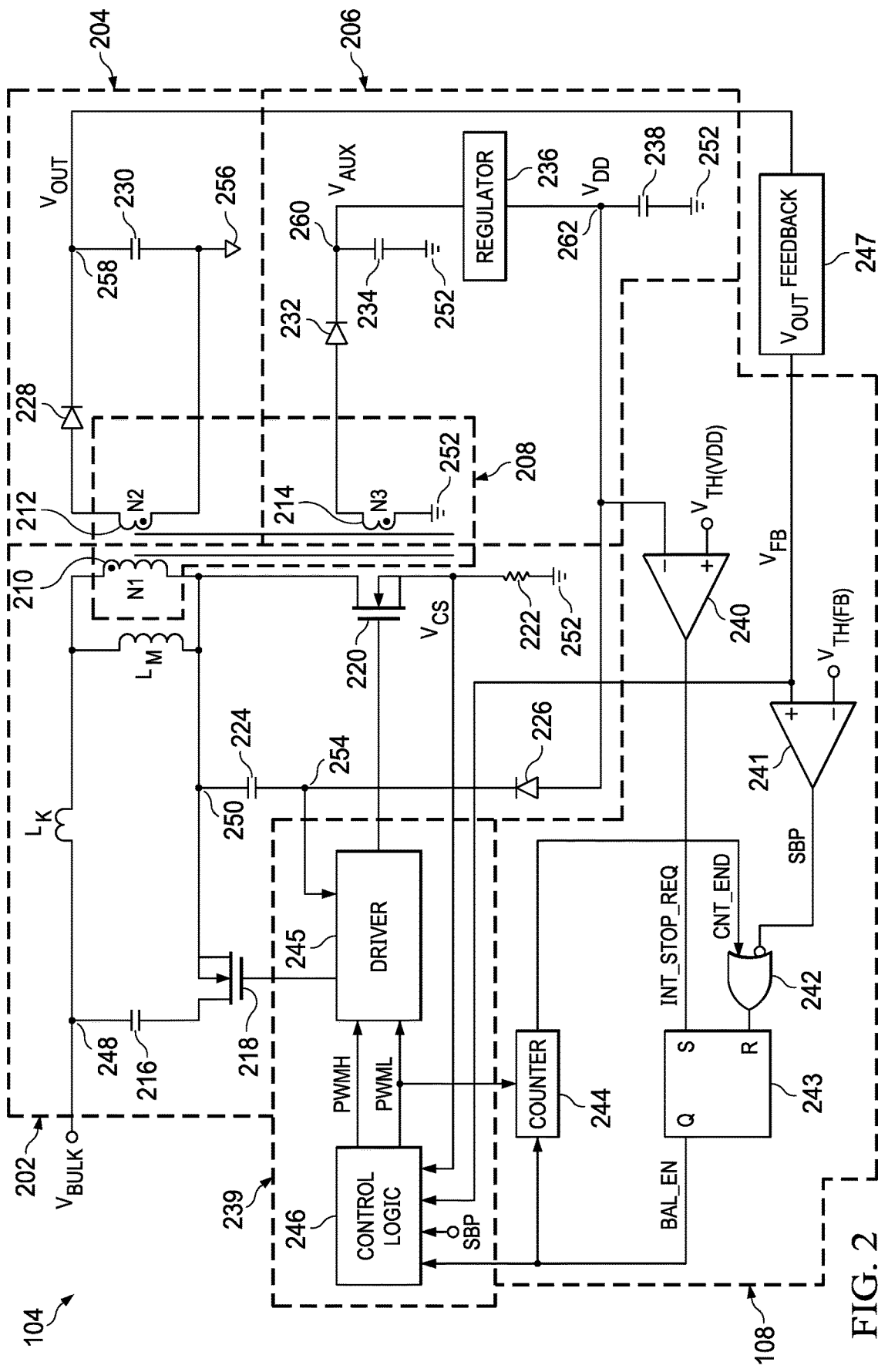
FIG. 2 shows a schematic diagram of an implementation of the DC-DC isolated power converter in accordance with various examples.

At least some examples of a direct current (DC) to DC (DC-DC) isolated power converter include an active clamp to reduce current stress on components of the DC-DC isolated power converter. Conventional technology typically utilizes an n-channel or a p-channel transistor between the primary coil of a transformer and ground to act as an active clamp. The DC-DC isolated power converter, in at least some examples, includes an input circuit having a primary capacitor that charges as the input circuit transfers power to an output circuit of the DC-DC isolated power converter. The output circuit also includes a secondary capacitor that charges as power is transferred to the output circuit from the input circuit and discharges to a load coupled to the output circuit. Unlike the secondary capacitor on the output side of the transformer, while the primary capacitor charges during power transfer, at least some examples of the DC-DC isolated power converter lack a load coupled in parallel with the primary capacitor. As such, in some circumstances the voltage across the primary capacitor does not follow the voltage across the capacitor of the output circuit. When the input circuit is switched such that power is again transferred to the output circuit, a voltage spike can occur in the output circuit resulting from the variance in stored charge of the capacitor of the input circuit and the capacitor of the output circuit. In at least some examples of the DC-DC isolated power converter, this voltage spike can damage and/or destroy a component of the output circuit.

There are conventional approaches for mitigating risks of damage to components of the output circuit. For example, one conventional approach includes coupling an impedance (such as a resistor) in parallel with the primary capacitor. This conventional approach reduces, but often does not eliminate, the voltage spike that can occur in the output circuit resulting from the variance in stored charge of the primary capacitor and the capacitor of the output circuit. However, while partially mitigating the risks of damage to the output circuit, this conventional approach increases a standby power of the DC-DC isolated power converter. The standby power, as used herein, is power consumed by the DC-DC isolated power converter while the DC-DC isolated power converter is not transferring power from the input circuit to the output circuit. In at least some examples of a DC-DC isolated power converter, acceptable limits are placed on the standby power by customers, regulatory bodies, or other entities. Coupling the impedance in parallel with the capacitor of the input circuit as in this conventional approach, sometimes causes the standby power of the DC-DC isolated power converter to exceed these acceptable limits. Another conventional approach for mitigating risks of damage to components of the output circuit includes coupling a snubber across one or more of the components of the output circuit that are susceptible to the damage. The snubber used in this conventional approach includes a resistor and a capacitor coupled in series and limits a voltage amplitude and/or rate of voltage increase for the component across which the snubber is coupled. However, the snubber increases power loss of the output circuit and therefore decreases efficiency of the DC-DC isolated power converter.

At least some aspects of this description provide for a balancing circuit that mitigates or reduces the variance in voltage between the capacitor of the input circuit and the capacitor of the output circuit. For example, a value of the voltage across the capacitor of the input circuit follows a value of the voltage across the capacitor of the output circuit more closely than in the absence of the balancing circuit at least partially as a result of the balancing circuit of this description. The balancing circuit, in some examples, bleeds energy from the input capacitor of the input circuit to an auxiliary circuit through which a supply voltage ($V_{DD}$) of the input circuit is generated. Accordingly, $V_{DD}$ is at least partially replenished or increased in value based on the energy bled from the input capacitor to the auxiliary circuit.

Referring now to FIG. 1, a block diagram of an illustrative system 100 is shown in accordance with various examples. In various examples, the system 100 is representative of a power adapter for a portable computer such as a laptop, notebook, or tablet device. In other examples, the system 100 is representative of a charger for a mobile communication device such as a smartphone. More generally, the system 100 is representative of any system or device including a DC-DC isolated power converter, and particularly any system or device including a high-voltage or high-power DC-DC isolated power converter. Accordingly, the system 100 is, in at least some examples, a system that may benefit from electrical isolation between input and output portions of a power converter of the system 100. Such benefits may relate to breaking or separation of ground loops in the system 100, creation of a floating output or performing level-shifting in the power converter, or to maintaining compliance with safety standards applicable to the system 100.

In some implementations, the system 100 includes a power source 102, a DC-DC isolated power converter 104, and a load 106. The power source 102 is adapted to be coupled to the DC-DC isolated power converter 104, which is adapted to be coupled to the load 106. While described herein as DC-DC, in at least some examples the DC-DC isolated power converter 104 instead receives an alternating current (AC) voltage input or provides an AC voltage output. In various examples, the power source 102 is any device or circuit capable of outputting a DC voltage. In some examples, the power source 102 is a rechargeable or non-rechargeable battery (or other power storage component) or a circuit coupled to and configured to process power output by such a battery. In other examples, the power source 102 is a rectifier or other circuit configured to convert an AC voltage to a DC voltage. In at least one example, the power source 102 outputs a voltage signal $V_{BULK}$ to the DC-DC isolated power converter 104 for processing by the DC-DC isolated power converter 104. The load 106 is any device, circuit, or component configured to receive a voltage signal $V_{OUT}$ from the DC-DC isolated power converter 104 and operate at least partially according to $V_{Out}$. As stated above, load 106 may be, or may be components of, a laptop or notebook computer, a tablet, a mobile communication device, a personal electronic device or a subsystem in an automobile.

The DC-DC isolated power converter 104, in at least some examples, includes a transformer (not shown) configured to generate $V_{OUT}$ according to a value of $V_{BULK}$ and a windings ratio of the transformer. However, other forms of isolation devices (such as galvanic devices) can be utilized within power converter 104 in place of, or in conjunction with, the transformer. In some examples, the DC-DC isolated power converter 104 is further configured to generate $V_{DD}$ according to a value of $V_{BULK}$ and another windings ratio of the transformer. The transformer has an associated primary-side magnetizing inductance and leakage inductance. The DC-DC isolated power converter 104 also includes, in some examples, an active clamp circuit (not shown). Energy stored by the primary-side magnetizing inductance is transferred to $V_{OUT}$. The energy stored by the leakage inductance, in at least some examples, creates a voltage spike in the transformer and places electrical (e.g., current) stress on one or more components of the transformer, potentially damaging the components. The active clamp circuit dissipates the energy stored by the leakage inductance to mitigate and/or prevent the stress on the component(s) of the transformer to protect the component(s) from damage. The energy is dissipated from the transformer by, in some examples, storing the energy in a capacitor (not shown). The active clamp circuit storing the energy in the capacitor, in some examples, increases efficiency of the DC-DC isolated power converter 104, enables the DC-DC isolated power converter 104 to operate at higher switching frequencies than in the absence of the active clamp circuit, and/or enables operation using a power source 102 with less energy delivery or supply capacity than in the absence of the active clamp circuit.

The active clamp circuit dissipating the energy stored by the leakage inductance and storing the energy in the capacitor creates a voltage imbalance between the capacitor and a second capacitor (not shown) of the DC-DC isolated power converter 104 coupled in parallel with the load 106. The voltage imbalance, in some examples, results in damage to one or more components after the capacitor and the second capacitor are coupled together via the transformer during a switching cycle of the DC-DC isolated power converter 104. The switching cycle is a cycle of operation during which switching (e.g., on and/or off) of one or more transistors of the DC-DC isolated power converter 104 is performed to cause the transformer 104 to electromagnetically couple energy from the input circuit to the output circuit to generate $V_{OUT}$. To at least partially protect against this damage, the DC-DC isolated power converter 104 also includes a balancing circuit 108. The balancing circuit 108, in at least some examples, bleeds energy from the primary capacitor on the primary side to reduce the voltage imbalance between the primary capacitor and the secondary capacitor on the secondary side. Responsive to the DC-DC isolated power converter 104 being controlled to reduce a value of $V_{OUT}$ from a first value to a second value that is less than the first value, the DC-DC isolated power converter 104 stops switching until $V_{OUT}$ decays (e.g., decreases in value) to be approximately equal to, or less than, the second value. While the DC-DC isolated power converter 104 is not switching, in at least some examples, the balancing circuit 108 bleeds energy stored by the capacitor until the voltage across the secondary capacitor decreases to a voltage approximately equal to the second programmed $V_{OUT}$ value. The bleeding of energy from the capacitor, in at least some examples, decreases a voltage across the capacitor to more closely match, though not necessarily equal, the voltage across the secondary capacitor. In at least some examples, the energy stored by the capacitor is bled through an auxiliary circuit (not shown) to harvest the stored energy for powering one or more components of the DC-DC isolated power converter 104, thus increasing efficiency of the DC-DC isolated power converter 104. Further, by bleeding the energy stored by the capacitor, in at least some examples, the balancing circuit 108 reduces a value of a voltage spike that may occur responsive to the DC-DC isolated power converter 104 resuming switching and the capacitor is coupled to the second capacitor via the transformer.

Referring now to FIG. 2, a schematic diagram of an implementation of the DC-DC isolated power converter 104 is shown in accordance with various examples. In at least some examples, the DC-DC power converter 104 includes an input circuit 202, an output circuit 204, and an auxiliary circuit 206. In at least some examples, the input circuit 202 includes the balancing circuit 108. The input circuit 202 is coupled to the output circuit 204 by a transformer 208 having a primary windings 210 in the input circuit 202 and a secondary windings 212 in the output circuit 204. The input circuit 202 is also coupled to the auxiliary circuit 206 by the transformer 208 having the primary windings 210 in the input circuit 202 and an auxiliary windings 214 in the auxiliary circuit 206. The input circuit 202, in some examples, further includes a capacitor 216, a transistor 218, a transistor 220, a resistor 222, a capacitor 224, and a diode 226. The resistor 222 is, in some examples, a current sense resistor across which a current sense voltage ($V_{CS}$) is dropped. The output circuit 204, in some examples, further includes a diode 228 and a capacitor 230. The diode 228 is, in some examples, a synchronous rectifier diode. The auxiliary circuit 206, in some examples, further includes a diode 232, a capacitor 234, a regulator 236, and a capacitor 238. The balancing circuit 108, in some examples, includes a comparator 240, a comparator 241, a logic circuit 242, and a SR latch 243. In at least some examples, the balancing circuit 108 further includes a counter 244. The logic circuit 242 is, in some examples, a logical OR digital logic circuit having an inverting input and a non-inverting input. In some examples, the inverting input for a logic gate is formed by using an inverting circuit (such as an inverter) that has an input coupled to a source of a signal to be received and an output of the inverting circuit (such as an inverter) coupled to the input of the logic circuit 242. The SR latch 243 is, in some examples, a set-reset latch. In at least some examples, the DC-DC isolated power converter 104 also includes a controller 239. The controller 239, in some examples, includes a driver 245, and control logic 246. Though illustrated separately from a remainder of the components of the controller 239, in at least some examples the controller 239 further includes a feedback circuit 247. While the balancing circuit 108 is illustrated and described herein as a separate component, in at least some examples the balancing circuit 108 is a component of the controller 239. In such examples, some, or all, components of the balancing circuit 108 are co-located with components of the controller 239, such as on a same semiconductor die, in a same package, etc. Furthermore, power converter 104 may be implemented in one or more semiconductor die and/or may be packaged in one or more encapsulations. Preferably, the transformer 208 is implemented separately.

In an example architecture of the DC-DC isolated power converter 104, the capacitor 216 has a first terminal coupled to a node 248 and a second terminal coupled through the transistor 218 to a node 250. The node 248 is, in some examples, an input node at which the DC-DC isolated power converter 104 is configured to receive $V_{BULK}$. For example, a drain of the transistor 218 is coupled to the second terminal of the capacitor 216 and a source of the transistor 218 is coupled to the node 250. The primary windings 210 is coupled between the node 248 and the node 250. While illustrated in FIG. 2 as including an inductor $L_K$ between the node 248 and the primary windings 210 and an inductor $L_M$ in parallel with the primary windings 210, $L_K$ and $L_M$ are not components of the DC-DC isolated power converter 104. Instead, $L_K$ is representative of a leakage inductance of the primary windings 210 and $L_M$ is representative of a primary-windings magnetic inductance of the primary windings 210. Referring again to the architecture of the DC-DC isolated power converter 104, the transistor 220 has a drain coupled to the node 250, a source coupled to a first ground node 252 through the resistor 222, and a gate. The capacitor 224 is coupled between the node 250 and a node 254 which is coupled to a cathode of the diode 226.

An anode of the diode 228 is coupled through the secondary windings 212 to a second ground node 256. A cathode of the diode 228 is coupled to a node 258. The node 258 is, in some examples, an output node at which the DC-DC isolated power converter 104 provides and/or outputs $V_{OUT}$. The capacitor 230 is coupled between the node 258 and the second ground node 256.

An anode of the diode 232 is coupled through the auxiliary windings 214 to the first ground node 252. A cathode of the diode 232 is coupled to a node 260. The capacitor 234 is coupled between the node 260 and the first ground node 252. A regulator 236 is coupled between the node 260 and a node 262. For example, an input of the regulator 236 is coupled to the node 260 and an output of the regulator 236 is coupled to the node 262. The regulator 236, in at least some examples, generates $V_{DD}$ at the node 262. The capacitor 238 is coupled between the node 262 and the first ground node 252. An anode of the diode 226 is coupled to the node 262.

The comparator 240 has an inverting input coupled to the node 262 and a non-inverting input configured to receive a first threshold voltage $V_{TH\ (VDD)}$. $V_{TH\ (VDD)}$, in some examples, is specified as a voltage slightly higher than an under-voltage threshold (UVLO) of the controller 239 at which the controller 239 ceases functioning. In at least some examples, $V_{TH(VDD)}$ is about 2.2V higher than UVLO. In other examples, $V_{TH(VDD)}$ is about 1.5-2.0V higher than UVLO. In yet other examples, a difference between $V_{TH(VDD)}$ and UVLO is chosen according to any suitable criteria for a particular system or device. The output of comparator 240 is coupled to the "set" input of set-reset (SR) latch 243. The comparator 241 has an inverting input configured to receive a second threshold voltage $V_{TH(FB)}$. $V_{TH(FB)}$, in at least some examples, specifies a programmed value for $V_{OUT}$. For example, a proportional relationship exists between $V_{OUT}$ and a feedback voltage $V_{FB}$ such that for a change in value of $V_{OUT}$, a proportional change in value occurs in $V_{FB}$ making $V_{FB}$ a scaled representation of $V_{OUT}$. The comparator 241 further has an output coupled to the inverting input of the logic circuit 242. A non-inverting input of the logic circuit 242 is coupled to an output of the counter 244. An output of the logic circuit 242 is coupled to a reset input of the SR latch 243. The counter 244 has a first input coupled to the output of the SR latch 243 and a second input.

The driver 245 includes a plurality of inputs, a first output coupled to a gate of the transistor 218 and a second output coupled to a gate of the transistor 220. The control logic 246 has a first input coupled to the output of the SR latch 243, a second input coupled to the output of the comparator 241, a third input coupled to the non-inverting input of the comparator 241, and a fourth input coupled to the source of the transistor 220. The control logic 246 further has a first output coupled to a first of the plurality of inputs of the driver 245 and a second output coupled to a second of the plurality of inputs of the driver 245. A third of the plurality of inputs of the driver 245 is coupled to the node 254. The feedback circuit 247 is coupled between the node 258 and the non-inverting input of the comparator 241. For example, an input of the feedback circuit 247 is coupled to the node 258 and an output of the feedback circuit 247 is coupled to the non-inverting input of the comparator 241.

In an example of operation of the DC-DC isolated power converter 104, $V_{BULK}$ is received at the node 248 and $V_{OUT}$ is generated at the node 258 based on the value of $V_{BULK}$, a value of $V_{FB}$, and a windings ratio of the primary windings 210 to the secondary windings 212. For example, when primary windings 210 has N1 windings turns and the secondary windings 212 has N2 windings turns, N2/N1*$V_{BULK}$ represents the voltage at the secondary winding. $V_{OUT}$ is a function (e.g., such as an averaged function) of the secondary windings voltage minus any losses associated with components in an output signal path of the DC-DC isolated power converter 104. In at least some examples, the controller 239 generates a first control signal (e.g., a Pulse Width Modulation, high-side signal, or PWMH) for controlling the transistor 218 and a second control signal (e.g., a (Pulse Width Modulation, low-side signal, or PWML) for controlling the transistor 220. The controller 239 generates PWML and PWMH based on at least a value of a standby power mode signal (SBP) output by the comparator 241 and a value output by the SR latch 243, indicated as BAL_EN. For example, responsive to SBP indicating that $V_{FB}$ is lesser in value than $V_{TH(FB)}$, the controller 239 controls the transistor 220 to switch on and off to transfer power from the node 248 to the transformer 208 to energize the transformer 208. Energizing the transformer 208, in at least some examples, causes the primary-side magnetizing inductance of the transformer 208 to store energy and charge the capacitor 224, which is sometimes referred to as a bootstrap capacitor. Energizing the transformer 208, in at least some examples, causes the primary windings 210 to transfer energy to the secondary windings 212 and/or the auxiliary windings 214. Conversely, responsive to $V_{OUT}$ transitioning from a high value to a low value, $V_{OUT}$ can be temporarily higher than a regulation setting of the feedback circuit 247 before $V_{OUT}$ settles to the low value. In this example, the feedback circuit 247 increases $V_{FB}$ to a value greater than $V_{TH(FB)}$ causing the comparator 241 to assert SBP and the controller 239 to therefore control the transistor 220 to not switch on and off and instead remain turned off. After each switching cycle of the transistor 220, in at least some examples, the controller 239 controls the transistor 218 to switch on and off to dissipate energy stored by a leakage inductance of the transformer 208 to the capacitor 216. The controller 239 controls the transistor 218 and the transistor 220, in some examples, by the control logic 246 generating the control signals PWMH and PWML. For example, in at least some examples the control logic 246 includes logic circuitry or other components suitable for comparing received signal values and generating output signals based on those comparisons. In some examples, the control logic 246 implements, or includes, a state machine suitable for comparing the received signal values and generating the output signals based on the comparisons. Based on values of PWMH and PWML, the driver 245 drives the transistor 218 and the transistor 220, respectively, by controlling values of signals provided at gates of the transistor 218 and the transistor 220. In at least some examples, the driver 245 biases a value of a signal provided at the gate of the transistor 218 (as based on PWMH) according to a value provided at the node 254.

The DC-DC isolated power converter 104 also generates an auxiliary voltage $V_{AUX}$ at the node 260 by transferring power from the input circuit 202 to the auxiliary circuit 206. For example, $V_{AUX}$ is generated at the node 260 based on the value of a voltage stored by the capacitor 216, a value of $V_{FB}$, a value of $V_{DD}$, and a windings ratio of the primary windings 210 to the auxiliary windings 214. For example, when the auxiliary windings 214 has N3 windings turns, $V_{AUX}$ has a value that is a function of, or approximately equal to N3/N2*$V_{OUT}$. Based on $V_{AUX}$ and a predetermined or programmed value, the regulator 236 generates $V_{DD}$ from $V_{AUX}$.

Responsive to $V_{OUT}$ transitioning from a high value to a low value, the comparator 241 de-asserts SBP such that the controller 239 disables switching of the transistor 218 and the transistor 220, preventing the auxiliary circuit 206 from obtaining power via the auxiliary windings 214 via the transformer 208. Therefore, $V_{AUX}$ begins to decrease in value as the capacitor 234 discharges to the regulator 236. Responsive to $V_{AUX}$ decreasing to a value insufficient to enable the regulator 236 to keep $V_{DD}$ at a programmed regulation level, $V_{DD}$ also begins to decrease in value. Responsive to $V_{DD}$ decreasing in value to approximately $V_{DD(TH)}$, the comparator 240 asserts INT_STOP_REQ and the SR latch 243 asserts BAL_EN. The assertion of BAL_EN counteracts the asserted value of SBP, causing the controller 239 to continue switching the transistor 218 and the transistor 220.

Responsive to BAL_EN being asserted, a capacitor voltage balancing function is performed. Accordingly, the assertion of BAL_EN is, in some examples, an indication of a $V_{OUT}$ transient event, as described above, which triggers the capacitor voltage balancing function of this description. To perform one cycle of the balancing function, in some examples, the controller 239 controls the transistor 218 and the transistor 220 to switch on and off to transfer power from the node 248 and the energy stored in the primary capacitor 216 to the transformer 208. This transfer energizes the transformer 208 such that the transformer 208 transfers energy to the auxiliary windings 214. Because $V_{AUX}$ has been discharged to a low value by the regulator 236 at the beginning of the $V_{OUT}$ transition period, $V_{AUX}$ is lesser in value than N3/N2*$V_{OUT}$. This voltage difference causes the diode 228 to not conduct energy between the secondary windings 212 and the node 258, preventing energy from being transferred by the transformer 208 to the node 258 as $V_{OUT}$ while energy is being transferred by the transformer 208 to the node 260 as $V_{AUX}$. For example, when the diode 232, coupled to the auxiliary windings 214 conducts energy (e.g., electromagnetically receives power from the primary windings 210), a voltage across the auxiliary windings 214 is approximately equal to the sum of a diode forward voltage drop ($VD_{AUX}$) of the diode 232 and $V_{AUX}$. A voltage across the secondary windings 212 is then in turn approximately equal to $N2/N3*(V_{AUX}+VD_{AUX})$. As $V_{AUX}$ is discharged from the node 260 by the regulator 236 during the $V_{OUT}$ transition, as discussed above, the voltage across the secondary windings 214 will be lower than $V_{OUT}$. This voltage differential causes the diode 228 to be reverse biased, preventing energy at the secondary windings 212 from being transferred to $V_{OUT}$.

The balancing circuit 108 generates BAL_EN based at least partially on a combination of values of VFB, $V_{TH(FB)}$, $V_{DD}$, and $V_{TH(VDD)}$. For example, when $V_{DD}$ becomes, or is, lesser in value than $V_{TH(VDD)}$, the comparator 240 outputs a signal INT_STOP_REQ having an asserted value. Otherwise, the comparator 240 outputs INT_STOP_REQ having a de-asserted value. When $V_{TH(FB)}$ becomes, or is, lesser in value than $V_{FB}$, the comparator 241 outputs SBP having an asserted value. Otherwise, the comparator 241 outputs SBP having a de-asserted value. Responsive to INT_STOP_REQ being asserted, the SR latch 243 is set such that BAL_EN has an asserted value. Responsive to SBP having a de-asserted value, an output of the logic circuit 242 is asserted such that the SR latch 243 is reset and BAL_EN has a de-asserted value. In examples of the balancing circuit 208 that include the counter 244, the counter 244 counts a number of pulses of PWML for which BAL_EN is asserted. Responsive to a count, as determined by the counter 244, exceeding a predetermined and/or programmed value, the counter 244 outputs a signal CNT_END having an asserted value. When the count is less than the predetermined and/or programmed value, the counter 244 outputs CNT_END having a de-asserted value. Responsive to CNT_END being asserted, in at least some examples, the output of the logic circuit 242 is asserted such that the SR latch 243 is reset and BAL_EN has the de-asserted value.

Further based on BAL_EN being enabled, the controller 239 controls the transistor 218 to turn on sequentially after the transistor 220 turns off. Based on the transistor 218 turning on while $V_{AUX}$ is lesser in value than $V_{OUT}$, the auxiliary circuit 206 attracts the energy stored by the magnetizing inductance of the transformer 208 and the energy stored by the capacitor 216. Thus, responsive to the transistor 218 being turned on and conductive, the transformer 208 transfers power from the input circuit 202 to the auxiliary circuit 206 based on the turn ratio N1/N3 and a voltage across the primary windings 210. The auxiliary circuit 206 receives the energy from the input circuit 202 to generate $V_{AUX}$ and the regulator 236 generates $V_{DD}$, charging the capacitor 238 and powering the controller 239. Responsive to $V_{DD}$ again decreasing in value to reach approximately $V_{TH(VDD)}$, the balancing circuit 108 again asserts BAL_EN and the above balancing function repeats.

In some examples, a single switching cycle of the transistor 220 is insufficient to charge the capacitor 224 to a level sufficient to enable the transistor 218 to subsequently turn on. In such examples, the controller 239 controls the transistor 220 to turn on and off multiple times prior to controlling the transistor 218 to turn on and off. In at least some examples, a number of switching cycles of the transistor 220 prior to a switching cycle of the transistor 218 is controlled by the counter 244. For example, the counter 244 counts a number of rising edges in PWML and, responsive to the count exceeding a programmed threshold, asserts CNT_END. After switching off the transistor 220, the counter 244 resets CNT_END to a de-asserted value and the balancing function proceeds as described above.

Figure 3:
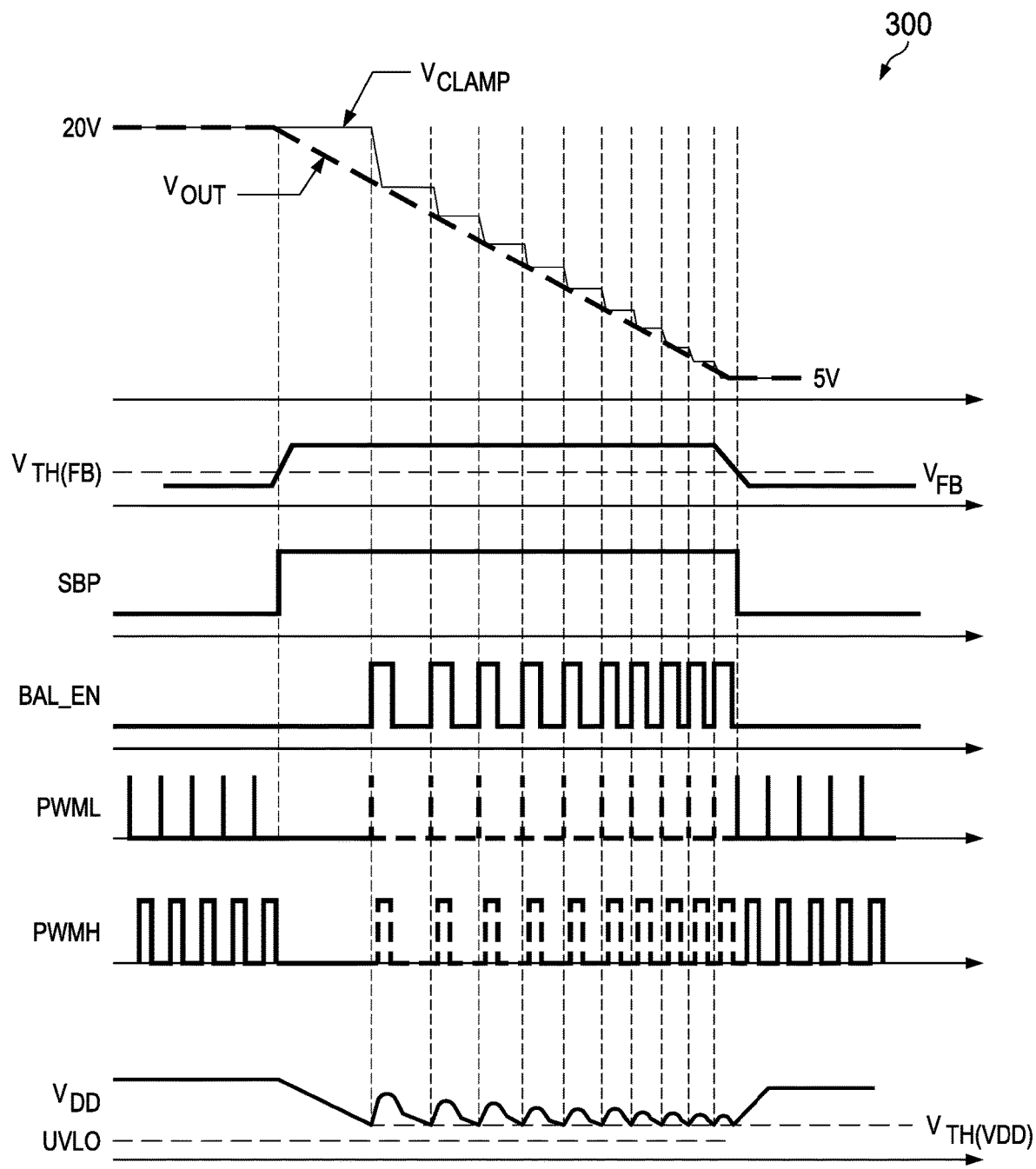
FIG. 3 shows a diagram of illustrative signal waveforms in accordance with various examples.

Referring now to FIG. 3, a diagram 300 of illustrative signal waveforms (with relative voltage values represented on the vertical axis and time on the horizontal axis) in accordance with various examples is shown. The diagram 300, in at least some examples, corresponds to signals present in the DC-DC isolated power converter 104, as described above with respect to FIG. 1 and/or FIG. 2. Accordingly, reference may be made to components of FIG. 1 and/or FIG. 2 in describing the diagram 300. The diagram 300 illustrates $V_{OUT}$, the voltage stored by the capacitor 216 ($V_{CLAMP}$), $V_{FB}$, $V_{TH(FB)}$, SBP, BAL_EN, PWML, PWMH, $V_{DD}$ $V_{TH(VDD)}$, and UVLO in accordance with at least one example of the DC-DC isolated power converter 104.

As illustrated by the diagram 300, responsive to $V_{OUT}$ decreasing in value, $V_{CLAMP}$ remains substantially unchanged as a result of the capacitor 216 lacking a resistor, or other loading component, coupled in parallel to dissipate the energy stored in the capacitor 216. Responsive to $V_{FB}$ being lesser in value than $V_{TH(FB)}$, SBP is de-asserted. While SBP is de-asserted, PWML and PWMH are each asserted and de-asserted once alternatingly per switching cycle to generate $V_{OUT}$. Responsive to $V_{FB}$ increasing to become equal to, or greater in value than, $V_{TH(FB)}$, SBP becomes asserted. Responsive to SBP being asserted, $V_{DD}$ begins to slowly discharge, decreasing in value. Responsive to $V_{DD}$ decreasing in value to approximately reach $V_{TH(VDD)}$, BAL_EN becomes asserted. Responsive to BAL_EN becoming asserted, PWML and PWMH are each asserted and de-asserted once alternatingly to transfer power from the capacitor 216 to the auxiliary circuit 206, increasing a value of $V_{DD}$ and decreasing a value of $V_{CLAMP}$. Responsive to $V_{DD}$ again decreasing in value to reach $V_{TH(VDD)}$, BAL_EN again becomes asserted and the above process repeats until $V_{FB}$ decreases in value to reach $V_{TH(FB)}$, or the counter 244 (signal not shown in the diagram 300) reaches the programmed value (e.g., a value programmed into the device during fabrication, a value programmed during testing of the final device, a value programmed by a user or a value set by values of external components connected to the device). Responsive to $V_{FB}$ decreasing in value to approximately reach $V_{TH(FB)}$, SBP becomes de-asserted and PWML and PWMH are each asserted and de-asserted once alternatingly per switching cycle to generate $V_{OUT}$, as described above.

Figure 4:
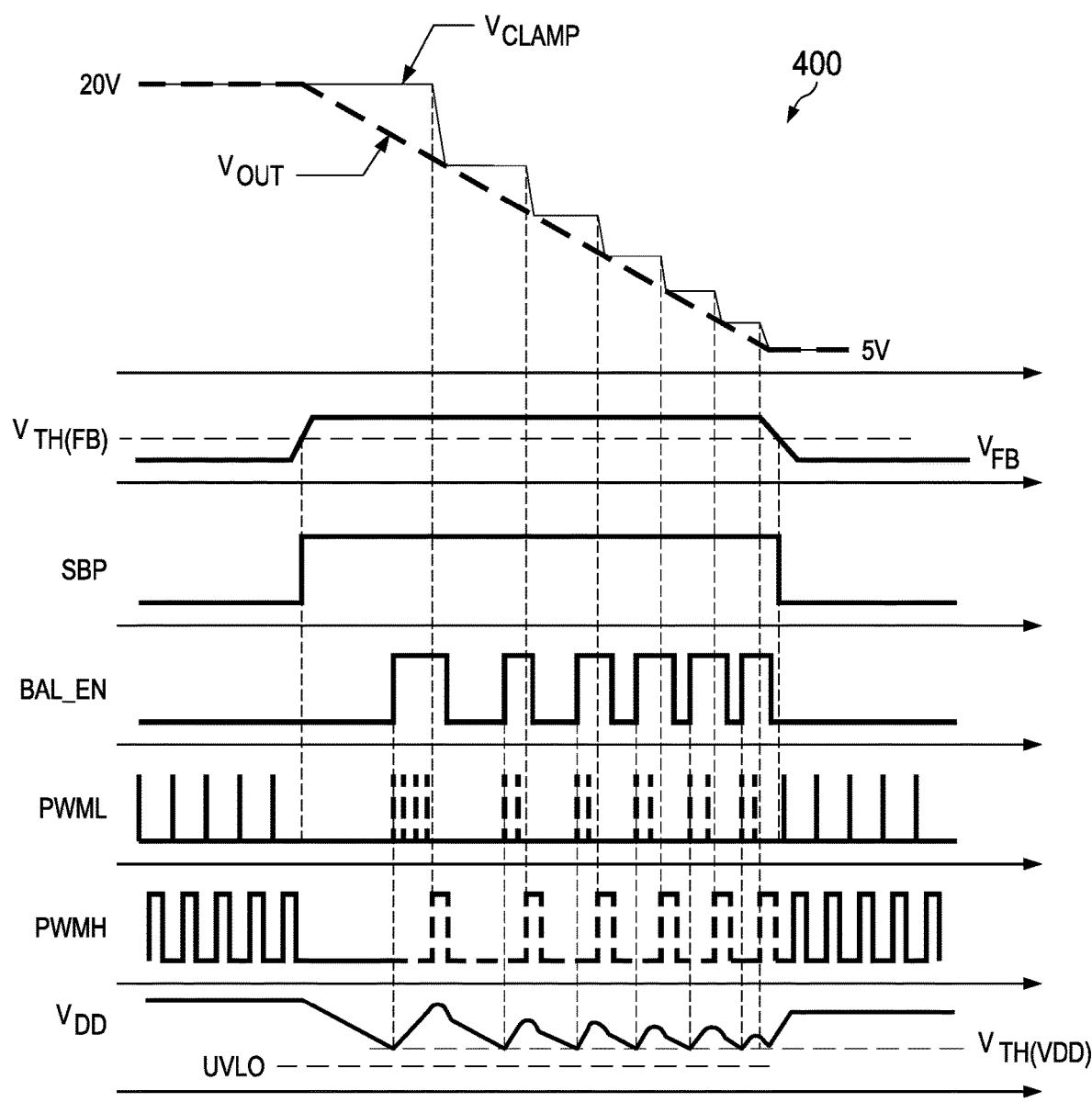
FIG. 4 shows a diagram of illustrative signal waveforms in accordance with various examples.

Referring now to FIG. 4, a diagram 400 of illustrative signal waveforms (with relative voltage values represented on the vertical axis and time on the horizontal axis) in accordance with various examples is shown. The diagram 400, in at least some examples, corresponds to signals present in the DC-DC isolated power converter 104, as described above with respect to FIG. 1 and/or FIG. 2. Accordingly, reference may be made to components of FIG. 1 and/or FIG. 2 in describing the diagram 400. The diagram 400 illustrates $V_{OUT}$, $V_{CLAMP}$, $V_{FB}$, $V_{TH(FB)}$, SBP, BAL_EN, PWML, PWMH, $V_{DD}$, $V_{TH(VDD)}$, and UVLO in accordance with at least one example of the DC-DC isolated power converter 104.

As illustrated by the diagram 400, responsive to $V_{OUT}$ decreasing in value, $V_{CLAMP}$ remains substantially unchanged as a result of the capacitor 216 lacking a resistor, or other loading component, coupled in parallel to dissipate the energy stored in the capacitor 216. Responsive to $V_{FB}$ being lesser in value than $V_{TH(FB)}$, SBP is de-asserted. While SBP is de-asserted, PWML and PWMH are each asserted and de-asserted once alternatingly per switching cycle to generate $V_{OUT}$. Responsive to $V_{FB}$ increasing to become equal to, or greater in value than, $V_{TH(FB)}$, SBP becomes asserted. Responsive to SBP being asserted, $V_{DD}$ begins to slowly discharge, decreasing in value. Responsive to $V_{DD}$ decreasing in value to approximately reach $V_{TH(VDD)}$, BAL_EN becomes asserted. Responsive to BAL_EN becoming asserted, PWML is asserted and de-asserted to create a plurality of pulses followed by PWMH being asserted and de-asserted once per switching cycle to transfer power from the capacitor 216 to the auxiliary circuit 206, increasing a value of $V_{DD}$ and decreasing a value of $V_{CLAMP}$. Responsive to $V_{DD}$ again decreasing in value to approximately reach $V_{TH(VDD)}$, BAL_EN again becomes asserted and the above process repeats until $V_{FB}$ decreases in value to reach $V_{TH(FB)}$ or the count (signal not shown in the diagram 300) of the counter 244 reaches the programmed value. Responsive to $V_{FB}$ decreasing in value to reach $V_{TH(FB)}$, SBP becomes de-asserted and PWML and PWMH are each asserted and de-asserted once alternatingly per switching cycle to generate $V_{OUT}$, as described above.

Referring now to FIG. 5, a flowchart of an illustrative method 500 of capacitor voltage balancing in accordance with various examples is shown. In at least some examples, the method 500 is implemented by the DC-DC isolated power converter 104, such as by the balancing circuit 108 and/or the controller 239, each as described in greater detail above. In at least some examples, the DC-DC isolated power converter 104 implements the method 500 to bleed energy from a primary capacitor (e.g., such as the capacitor 216) to approximately balance voltages of the primary capacitor and a secondary capacitor (e.g., such as the capacitor 230).

At operation 502, the DC-DC isolated power converter 104 monitors a value of $V_{FB}$ with respect to $V_{TH(FB)}$. In at least some examples, $V_{FB}$ is representative of a value of $V_{OUT}$. For example, in some implementations $V_{FB}$ is a scaled-down representation of $V_{OUT}$. Based on $V_{FB}$ being greater in value than $V_{TH(FB)}$, the method 500 proceeds to operation 504. Based on $V_{FB}$ not being greater in value than $V_{TH(FB)}$, the method 500 remains at operation 502.

At operation 504, the DC-DC isolated power converter 104 monitors a value of $V_{DD}$ with respect to $V_{TH(VDD)}$. Based on $V_{DD}$ not being greater in value than $V_{TH(VDD)}$, the method 500 proceeds to operation 506. Based on $V_{DD}$ being greater in value than $V_{TH(VDD)}$ the method 500 returns to operation 502. Alternatively, although not shown in FIG. 5, in some examples based on $V_{DD}$ being greater in value than $V_{TH(VDD)}$ the method 500 remains at operation 504.

At operation 506, the DC-DC isolated power converter 104 performs switching to energize the transformer 208. In at least some examples, switching of a first transistor (e.g., such as the transistor 220) of the DC-DC isolated power converter 104 stores energy in a magnetic inductance of the transformer 208 and charges a bootstrap capacitor (e.g., such as the capacitor 224) of the DC-DC isolated power converter 104.

At operation 508, the DC-DC isolated power converter 104 performs switching to transfer power to the auxiliary circuit 206. In at least some examples, switching of a second transistor (e.g., such as the transistor 218) of the DC-DC isolated power converter 104 transfers the energy stored in the magnetic inductance of the transformer 208 and a clamp capacitor (e.g., such as the capacitor 216) to the auxiliary circuit 206. Switching of the second transistor, in at least some examples, causes the DC-DC isolated power converter 104 to bleed stored energy from the clamp capacitor to the auxiliary circuit 206, preventing a large voltage differential from forming between the clamp capacitor and an secondary capacitor (e.g., such as the capacitor 230).

Referring now to FIG. 6, a flowchart of an illustrative method 600 in accordance with various examples is shown. In at least some examples, the method 600 is implemented by the DC-DC isolated power converter 104, such as by the controller 239 via the control logic 246, each as described in greater detail above. In at least some examples, the DC-DC isolated power converter 104 implements the method 600 to generate transistor gate control signals for controlling switching operation of transistors. For example, in some implementations the DC-DC isolated power converter 104 implements the method 600 to generate, via the controller 239 and control logic 246, PWMH and PWML, as described elsewhere herein, on which control of the transistor 218 and the transistor 220 is at least partially based.

At operation 602, the control logic 246 determines whether SBP is de-asserted. As used in this description, SBP is de-asserted when SBP has a low-level logical value (e.g., a value of logic "0") and SBP is asserted when SBP has a high-level logical value (e.g., a value of logic "1"). SBP is de-asserted, in at least some examples, based on $V_{FB}$ being lesser in value than $V_{TH\_(FB)}$, as determined by the comparator 241. However, other implementations are possible in which SBP is instead de-asserted when having a high-level logical value and asserted when having a low-level logical value. Based on SBP being de-asserted, the method 600 proceeds to operation 604.

At operation 604, the control logic 246 generates PWML having an asserted value and PWMH having a de-asserted value. After generating PWML and PWMH, the method 600 proceeds to operation 606.

At operation 606, the control logic 246 determines whether $V_{CS}$ is greater in value than fn(VFB). For example, fn($V_{FB}$) is an internal threshold of the control logic 246, determined according to a value of $V_{FB}$. $V_{CS}$ represents a voltage across the resistor 222. The control logic 246 compares $V_{CS}$ to fn($V_{FB}$) to determine whether or not to de-assert PWML. Based on $V_{CS}$ not being greater in value than fn($V_{FB}$), the method 600 remains at operation 606. Based on $V_{CS}$ being greater in value than fn($V_{FB}$), the method 600 proceeds to operation 608.

At operation 608, the control logic 246 generates PWML having a de-asserted value and PWMH having an asserted value. After generating PWML and PWMH, the method 600 proceeds to operation 610.

At operation 610, the control logic 246 determines whether T_TDM is de-asserted. T_TDM, in at least some examples, specifies a duration or pulse width for PWMH. When the duration or pulse width for PWMH has not expired, T_TDM has an asserted value. When the duration or pulse width for PWMH has expired, T_TDM has a de-asserted value. Based on T_TDM not being de-asserted, the method 600 remains at operation 610. Based on T_TDM being de-asserted, the method proceeds to operation 612.

At operation 612, the control logic 246 generates PWML having a de-asserted value and PWMH having a de-asserted value. After generating PWML and PWMH, the method 600 proceeds to operation 602.

Referring again to operation 602, based on SBP being not de-asserted, the method 600 proceeds to operation 614. At operation 614, the control logic 246 determines whether BAL_EN is asserted. For BAL_EN to asserted, in at least some examples, $V_{DD}$ has fallen to be approximately equal to, or lesser than, $V_{TH(VDD)}$. Based on BAL_EN not being asserted, the method 600 returns to operation 602. Based on BAL_EN being asserted, the method 600 proceeds to operation 616.

At operation 616, the control logic 246 generates PWML having an asserted value and PWMH having a de-asserted value. After generating PWML and PWMH, the method 600 proceeds to operation 618.

At operation 618, the control logic 246 determines whether $V_{CS}$ is greater in value than $fn(V_{FB})$. Based on $V_{CS}$ not being greater in value than $fn(V_{FB})$, the method 600 remains at operation 618. Based on $V_{CS}$ being greater in value than $fn(V_{FB})$, the method 600 proceeds to operation 620.

At operation 620, the control logic 246 generates PWML having a de-asserted value and PWMH having a de-asserted value. After generating PWML and PWMH, the method 600 proceeds to operation 622.

At operation 622, the control logic 246 determines whether BAL_EN is de-asserted. For BAL_EN to be de-asserted, in at least some examples, $V_{FB}$ has fallen to be equal to or lesser in value than $V_{TH(FB)}$, or CNT_END is asserted. Based on BAL_EN being de-asserted, the method 600 returns to operation 608. Based on BAL_EN not being de-asserted, the method 600 returns to operation 616.

While the operations of the method 500 and the method 600 have been described and labeled with numerical reference, in various examples the method 500 and/or the method 600 includes additional operations that are not recited herein (e.g., such as intermediary comparisons, logical operations, processing, signal selections such as via a multiplexer, etc.). In some examples, any one or more of the operations recited herein includes one or more sub-operations (e.g., such as intermediary comparisons, logical operations, signal selections such as via a multiplexer, etc.). In some examples, any one or more of the operations recited herein is omitted, and/or in some examples any one or more of the operations recited herein is performed in an order other than that presented herein (e.g., in a reverse order, substantially simultaneously, overlapping, etc.). All of these alternatives fall within the scope of this description.

The term "couple" is used throughout the description. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. As used herein, "electromagnetic(ally) coupling" includes one that lacks physical connections, such as a transformer in which energy passes from first windings to second windings via principles of electromagnetism without the first and second windings physically contacting each other. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components illustrated as resistors, unless otherwise stated, are generally representative of any one or more elements coupled in series and/or parallel to provide an amount of impedance represented by the illustrated resistor. For example, a resistor or capacitor illustrated and described herein as a single component may instead be multiple resistors or capacitor, respectively, coupled in parallel between the same nodes. As another example, a resistor or capacitor illustrated and described herein as a single component may instead be multiple resistors or capacitor, respectively, coupled in series between the same two nodes as the single resistor or capacitor. Also, uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

Modifications are possible in the described embodiments or examples, and other embodiments or examples are possible, within the scope of the claims.

What is claimed is:

1. A circuit operable to be coupled to a transformer having primary windings, secondary windings and auxiliary windings, the secondary windings and the auxiliary windings electromagnetically coupled to the primary windings and the circuit comprising:
an input circuit including:
a primary capacitor having a first terminal and a second terminal, the first terminal adapted to be coupled to a first terminal of the primary windings of the transformer;
a first transistor coupled between the second terminal of the primary capacitor and a second terminal of the primary windings;
a resistor; and
a second transistor coupled between the second terminal of the primary windings and a ground node through the resistor;
an output circuit comprising a secondary capacitor adapted to be coupled to the secondary windings of the transformer;
an auxiliary circuit adapted to be coupled to the auxiliary windings of the transformer; and
a balancing circuit coupled between the output circuit, the auxiliary circuit, and the input circuit, the balancing circuit configured to balance a voltage across the primary capacitor with a voltage across the secondary capacitor.

2. The circuit of claim 1, wherein the input circuit comprises:
   a second capacitor; and
   a diode having an anode and a cathode, the anode coupled to the auxiliary circuit and the cathode coupled to the second terminal of the primary windings through the second capacitor.

3. The circuit of claim 1, wherein the output circuit comprises:
   a diode having an anode and a cathode, the anode coupled to a first terminal of the secondary windings and the cathode coupled to a ground node through the secondary capacitor, wherein a second terminal of the secondary windings is coupled to the ground node.

4. The circuit of claim 1, wherein the auxiliary circuit comprises:
   a first capacitor;
   a diode having an anode and a cathode, the anode coupled to a first terminal of the auxiliary windings and the cathode coupled to a ground node through the first capacitor, wherein a second terminal of the secondary windings is coupled to the ground node;
   a second capacitor; and
   a regulator coupled between the cathode of the diode and the ground node through the second capacitor.

5. The circuit of claim 1, further comprising a controller that comprises:
   control logic having multiple inputs and outputs, wherein first and second control logic inputs are coupled to the balancing circuit and a third control logic input is coupled to the input circuit;
   a feedback circuit coupled between the output circuit and a fourth control logic input; and
   a driver having first and second driver inputs coupled to first and second control logic outputs, a third driver input coupled to the input circuit, and first and second driver outputs coupled to the input circuit, wherein the second control logic output is further coupled to the balancing circuit.

6. The circuit of claim 5, wherein the balancing circuit comprises:
   a first comparator having an inverting input terminal coupled to the auxiliary circuit, a non-inverting input configured to receive a first threshold value, and an output;
   a second comparator having an inverting input terminal coupled to the auxiliary circuit, a non-inverting input configured to receive a first threshold value, and an output coupled to the second control logic input;
   a logic circuit having a logic circuit input and a logic circuit output, the logic circuit input is coupled to the second comparator output; and
   a latch having a latch set input, a latch reset input, and a latch output, wherein the latch set input is coupled to the first comparator output, the latch reset input is coupled to the logic circuit output, and the latch output is coupled to the first control logic input.

7. The circuit of claim 6, wherein the logic circuit further has a second logic circuit input, and wherein the balancing circuit further comprises a counter having a first counter input coupled to the latch output, a second counter input coupled to the control logic second output, and an output coupled to the second logic circuit input.

8. The circuit of claim 1, wherein the balancing circuit is configured to bleed energy from the primary capacitor to the auxiliary circuit to balance the voltage across the primary capacitor with the voltage across the secondary capacitor.

9. A system, comprising:
   a transformer having primary windings adapted to be coupled to a power source, secondary windings adapted to be coupled to a load and auxiliary windings, the secondary windings and the auxiliary windings electromagnetically coupled to the primary windings; and
   a power converter including:
     an input circuit comprising a primary capacitor coupled to the primary windings;
     an output circuit comprising a secondary capacitor coupled to the secondary windings of the transformer;
     an auxiliary circuit comprising the auxiliary windings; and
     a balancing circuit coupled to the output circuit, the auxiliary circuit, and the input circuit, the balancing circuit configured to balance a voltage across the primary capacitor with a voltage across the secondary capacitor;
   wherein the input circuit is configured to:
     store energy in a magnetizing inductance of the primary windings and a leakage inductance of the primary windings;
     transfer the energy stored in the magnetizing inductance to the secondary windings; and
     dissipate the energy stored in the leakage inductance to the primary capacitor.

10. The system of claim 9, wherein the power converter further comprises a controller comprising:
   control logic having multiple inputs and outputs, wherein first and second control logic inputs are coupled to the balancing circuit and a third control logic input is coupled to the input circuit;
   a feedback circuit coupled between the output circuit and a fourth control logic input; and
   a driver having first and second driver inputs respectively coupled to first and second control logic outputs, a third driver input coupled to the input circuit, and first and second driver outputs coupled to the input circuit, wherein the second control logic output is further coupled to the balancing circuit.

11. The system of claim 10, wherein the balancing circuit comprises:
   a first comparator having an inverting input terminal coupled to the auxiliary circuit, a non-inverting input configured to receive a first threshold value, and an output;
   a second comparator having an inverting input terminal coupled to the auxiliary circuit, a non-inverting input configured to receive a first threshold value, and an output coupled to the second control logic input;
   a logic circuit having a first logic circuit input and a logic circuit output, wherein the first logic circuit input is coupled to the second comparator output; and
   a latch having a set input, a reset input, and an output, wherein the set input is coupled to the first comparator output, the reset input is coupled to the logic circuit output, and the output is coupled to the first control logic input.

12. The system of claim 11, wherein the logic circuit further has a second logic circuit input, and wherein the balancing circuit further comprises a counter having a first counter input coupled to the latch output, a second counter input coupled to the second logic circuit output, and a counter output coupled to the second logic circuit input.

13. The system of claim 9, wherein the balancing circuit is configured to bleed energy from the primary capacitor to the auxiliary circuit to balance the voltage across the primary capacitor with the voltage across the secondary capacitor.

14. The system of claim 9, wherein the balancing circuit is configured to bleed energy stored in the primary capacitor to the auxiliary circuit to balance the voltage across the primary capacitor with the voltage across the secondary capacitor.

15. A circuit, comprising:
   a balancing circuit configured to:
      determine whether a feedback voltage exceeds a feedback voltage threshold;
      determine whether a supply voltage is not greater than a supply voltage threshold; and
      assert a balancing function enable signal based on the feedback voltage exceeding the feedback voltage threshold and the supply voltage is not greater than the supply voltage threshold; and
   control logic configured to:
      generate transistor control signals configured to cause a transformer to transfer energy to an output circuit configured to generate an output voltage and an auxiliary circuit responsive to the feedback voltage not exceeding the feedback voltage threshold, wherein the auxiliary circuit generates the supply voltage; and
      generate transistor control signals configured to cause the transformer to transfer energy to the auxiliary circuit responsive to the balancing function enable signal being asserted.

16. The circuit of claim 15, wherein transferring energy to the auxiliary circuit responsive to the balancing function enable signal being asserted transfers energy from an input capacitor coupled to the transformer to the auxiliary circuit.

17. The circuit of claim 15, wherein transferring energy to the auxiliary circuit responsive to the balancing function enable signal being asserted does not increase a value of the output voltage.

18. The circuit of claim 15, wherein the balancing circuit is further configured to de-assert the balancing function enable signal responsive to a count of one of the transistor control signals exceeding a programmed threshold or the feedback voltage not exceeding the feedback voltage threshold.

19. The circuit of claim 15, wherein transferring energy to the auxiliary circuit responsive to the balancing function enable signal being asserted balances an input capacitor of the input circuit with an secondary capacitor of the output circuit.

* * * * *